United States Patent [19]
Burdick

[11] Patent Number: 5,255,431
[45] Date of Patent: Oct. 26, 1993

[54] METHOD OF USING FROZEN EPOXY FOR PLACING PIN-MOUNTED COMPONENTS IN A CIRCUIT MODULE

[75] Inventor: William E. Burdick, Niskayuna, N.Y.

[73] Assignee: General Electric Company, Schenectady, N.Y.

[21] Appl. No.: 904,719

[22] Filed: Jun. 26, 1992

[51] Int. Cl.5 .............................................. H05K 3/34
[52] U.S. Cl. ....................................... 29/840; 29/830; 156/299; 174/138 G; 174/260; 439/209; 361/760; 361/767
[58] Field of Search ....................... 156/628, 643, 299; 364/490; 29/840, 832, 830; 174/255, 138 G, 260; 361/400, 403; 437/183; 439/68, 209

[56] References Cited

U.S. PATENT DOCUMENTS

| | | | |
|---|---|---|---|
| 3,749,347 | 7/1973 | Schumer | 174/138 G |
| 3,818,279 | 6/1974 | Seeger, Jr. et al. | 361/403 X |
| 4,184,043 | 1/1980 | Hildering | 174/260 |
| 4,714,516 | 12/1987 | Eichelberger et al. | 156/628 |
| 4,721,831 | 1/1988 | Vora | 174/255 |
| 4,764,485 | 8/1988 | Loughran et al. | 437/225 |
| 4,774,634 | 9/1988 | Tate et al. | 361/400 |
| 4,780,177 | 10/1988 | Wojnarowski et al. | 156/643 |
| 4,783,695 | 11/1988 | Eichelberger et al. | 357/65 |
| 4,814,944 | 3/1989 | Sagawa et al. | 361/403 |
| 4,835,704 | 5/1989 | Eichelberger et al. | 364/490 |
| 4,842,677 | 6/1989 | Wojnarowski et al. | 156/643 |
| 4,894,115 | 1/1990 | Eichelberger et al. | 156/643 |
| 5,074,947 | 12/1991 | Estes et al. | 156/299 X |
| 5,147,210 | 9/1992 | Patterson et al. | 29/830 X |

FOREIGN PATENT DOCUMENTS 1-24431 1/1989 Japan ..................................... 439/209

*Primary Examiner*—Carl J. Arbes
*Attorney, Agent, or Firm*—Ann Marie Kratz; Marvin Snyder; Geoffrey H. Krauss

[57] ABSTRACT

Pin-mounted components, such as DIP-packaged devices, multi-pin toroids and memory cubes are integrated into high density interconnect (HDI) structures by external attachment. Frozen spheres of conductive epoxy are placed, using automated pick-and-place equipment, into laser-drilled well-like via holes in an HDI module and then thawed under temperature and vacuum, prior to component pin insertion. Precision dispensing and uniform dispersion of adhesive results.

18 Claims, 7 Drawing Sheets

METHOD OF USING FROZEN EPOXY FOR PLACING PIN-MOUNTED COMPONENTS IN A CIRCUIT MODULE

CROSS-REFERENCE TO RELATED APPLICATION

This invention is related to the invention in commonly-assigned application Ser. No. 07/904,930, filed concurrently herewith, by Robert J. Wojnarowski and J. W. Rose and entitled "Integration of Pin-Mounted Components Into High Density Interconnect Structures", the entire disclosure of which is hereby expressly incorporated by reference.

BACKGROUND OF THE INVENTION

The present invention relates to the integration of pin-mounted components, such as ordinary DIP packages, with various base elements to form integrated electronic systems. One form of base element is a multichip electronic module having a plurality of integrated circuit chips and other components electrically interconnected in a high density interconnect (HDI) structure.

As disclosed in Eichelberger et al. U.S. Pat. No. 4,783,695, and related patents such as those referenced hereinbelow, a high density interconnect structure as developed by General Electric Company offers many advantages in the compact assembly of digital and other electronic systems. For example, an electronic system such as a microcomputer which incorporates between thirty and fifty chips, or even more, can be fully assembled and interconnected on a single substrate which is two inches long by two inches wide by 50 mils thick. This structure is referred to herein as an "HDI structure", and the various previously-disclosed methods for fabricating it are referred to herein as "HDI fabrication techniques".

Briefly, this high density interconnect structure employs, a ceramic substrate which may be made of alumina, for example, with a thickness between 25 and 100 mils. The substrate is of appropriate size and strength for the overall electronic system in which it is utilized. This size is typically on the order of two inches square.

Individual cavities, or one large cavity having appropriate depths at the intended locations of the various chips, are prepared. This may be done by starting with a bare substrate having a uniform thickness and the desired size. Conventional, laser or ultrasonic milling is used to form the cavities in which the various chips and other components are subsequently positioned. For systems where it is desired to place chips of uniform size edge-to-edge, a single large cavity may be satisfactory.

The various components are placed in their desired locations within the cavities and adhered by means of a thermoplastic adhesive layer, preferably Ultem ® polyetherimide resin available from General Electric Company, Pittsfield, Mass. Thus the structure is a "chips first" structure. More particularly, the entire structure is heated to the softening point of the Ultem polyetherimide (in the vicinity of 217° C. to 235° C. depending on the formulation used) and then cooled to thermoplastically bond the individual components to the substrate. At this stage, the upper surfaces of all components and the substrate are disposed in substantially a common plane.

A multi-layer interconnect overcoat structure is then built up to electrically interconnect the components into an actual functioning system. To begin the HDI overcoat structure, a polyimide dielectric film, which may be Kapton ® polyimide, about 0.0005 to 0.003 inch (12.5 to 75 microns) thick and available from E. I. du Pont de Nemours & Company, Wilmington, Del., is pretreated to promote adhesion and coated on one side with Ultem polyetherimide resin or another thermoplastic and laminated across the top of the chips, other components and the substrate, with the Ultem resin serving as a thermoplastic adhesive to hold the Kapton film in place.

The actual as-placed locations of the various components and contact pads thereon are determined, and via holes are adaptively laser drilled in the Kapton film and Ultem adhesive layers in alignment with the contact pads on the electronic components. Exemplary laser drilling techniques are disclosed in Eichelberger et al. U.S. Pat. Nos. 4,714,516 and 4,894,115; and in Loughran et al. U.S. Pat. No. 4,764,485.

A metallization layer is deposited over the Kapton film layer and extends into the via holes to make electrical contact to the contact pads disposed thereunder. This metallization layer may be patterned to form individual conductors during the process of depositing it, or may be deposited as a continuous layer and then patterned using photoresist and etching. The photoresist is preferably exposed using a laser which is scanned relative to the substrate to provide an accurately aligned conductor pattern at the end of the process. Exemplary techniques for patterning the metallization layer are disclosed in Wojnarowski et al. U.S. Pat. Nos. 4,780,177 and 4,842,677; and in Eichelberger et al. U.S. Pat. No. 4,835,704 which discloses an "Adaptive Lithography System to Provide High Density Interconnect". Any misposition of the individual electronic components and their contact pads is compensated for by an adaptive laser lithography system as disclosed in U.S. Pat. No. 4,835,704.

Additional dielectric and metallization layers are provided as required in order to make all of the desired electrical connections among the chips.

The ability to extend into the third dimension is highly desirable in electronics, especially multichip module electronics. Thus, commonly-assigned Wojnarowski et al. allowed application Ser. No. 07/504,749, filed Apr. 5, 1990 entitled "High Density Interconnect Structure With Top-Mounted Components" discloses a configuration where the functionality, versatility, connection and packing density of a multi-chip module high density interconnect structure are enhanced by mounting one or more components on top of the high density interconnect structure and connecting these top-mounted components in various ways to conductors of the high density interconnect structure and the chips embedded therein.

The techniques disclosed in Ser. No. 07/504,749 are not, however, particularly suitable for use in combination with pin-mounted components such as standard DIP (Dual In-Line Pins) packages, magnetic toroids, memory cube devices and other pin-mounted components. As another example, programmable devices such as EPROMS (Erasable, Programmable, Read Only Memories) and various programmable logic devices are commonly available in DIP packages, and could be readily used in combination with HDI structures if a suitable interconnection technique were known. Of particular interest are memory cubes such as those made by Texas Instruments and by Irvine Sensors. Such memory cubes typically have pins which are ten to twenty mils in length and spaced approximately twenty to twenty-five mils center-to-center in a rectangular array of 240 pins having an overall size of 0.567 inch long by 0.172 inches wide.

These pin-mounted components could be potted and lapped, and then incorporated into an HDI structure at the same time as semiconductor chips are mounted (but in cavities deeper compared to the usual HDI process). However, the cost would be relatively high, and there are numerous practical difficulties related to potting, pin alignment, and pad out interfaces. For example, in the case of memory cubes, variation in lead positioning within the cube, and cube-to-cube variations, are incompatible with micron HDI dimensioning, even when the adaptive lithography techniques are employed.

Thus it remains desirable to mount the pin-mounted components on top of an HDI structure. It would further be desirable to make mass memory modules with high cube-to-cube packing density in a manner which is cost effective, mechanically sound, repairable and reliable. Conceptually, interconnect pads could be provided on top of the HDI structure, and the pins of the pin-mounted components somehow attached and electrically connected, somewhat in the manner as is done in the case of conventional surface mount technology.

Interconnections between metal surfaces that mate together can be accomplished only in a limited number of ways. Soldering, conductive gluing, vacuum metal deposition, and welding are some of these ways.

Vacuum metal deposition techniques used in the present HDI process cannot be used to interconnect bottom pinout devices, since the metal deposition will not form an adequate connection with pins that are undershadowed by the part in this manner.

Soldering would be a possibility. However, the HDI process at present is not readily compatible with 200°-260° C. soldering temperatures, due to the limitations of the interlayer adhesives. Additionally, surface bonding of pins to interconnect pads is not practical when employing wave soldering. Further, solder "wicks up" or flows readily into regions of the memory cubes intended to be solder-free when the cubes are processed at temperatures greater than 195°-200° C. Still further, the application and removal of solder fluxes are difficult. Thus, soldering arrays of pins of pin-mounted components to pads is a near impossibility, and would result in extremely low yields.

Another consideration is that memory cubes have pins protruding outward which are not controlled to a tight tolerance; that is they experience random overall runout from one end to the other, as well as skew from row to row. To adapt to HDI processes as previously practiced would require a direct measurement of each memory cube and adjustment of the artwork for each. This is highly undesirable, due to the measurement times involved. To interface these two technologies would require an exact measurement and placement and surface bonding. HDI has some height variations from chip to chip and does not lend itself to use of absolutely flat mounting surfaces of each pin within the memory cube array.

In short, the application of surface mount solders and/or glues and to perfectly align hundreds, to many thousands of small pads, with variable length pins, protruding out of the memory cubes becomes statistically very difficult. The solders and glues melt and move, making connections unreliable and blind joint inspection impossible.

The above-identified related application Ser. No. 07/904,930 discloses an electronic system which integrates a base element with a pin-mounted component. As disclosed in that application, the base element has a generally planar boundary with interconnect pads on the boundary. As one example, the base element may comprise a high density interconnect (HDI) assembly including a substrate with at least one cavity, a plurality of electronic components disposed within the cavity and having contacts thereon, and a multilayer interconnect structure overlying and bonded to the electronic components and interconnecting selected ones of the component contact pads. The multilayer interconnect structure includes interleaved layers of dielectric material and conductive material, and an upper portion of the multilayer interconnect structure comprises the planar boundary having interconnect pads thereon. As another example, the base element may comprise a printed circuit board or other substrate, with or without a multilayer interconnect structure.

In the method disclosed in Ser. No. 07/904,930 for integrating a pin-mounted component and a base element, a polymer mask layer is applied to the base element surface, also referred to herein as the base element planar boundary. The polymer mask layer thickness is within the approximate range of two to ten mils, and may be applied by adhesively bonding a sheet of polymer material to the base element. A spin-on or spray-on glue may be applied to the base element or to the mask layer directly, then dried, and the mask layer bonded to the base element.

Next, well-like via holes are formed in the polymer mask layer over the interconnect pads, extending to and exposing at least portions of the interconnect pads, enabling electrical connections thereto. The preferred method for forming the well-like via holes is laser dithering, such as disclosed in Eichelberger et al. U.S. Pat. No. 4,894,115. Preferably, the holes are formed of sufficient size to accommodate runout tolerances in the locations of the connection pins of the pin-mounted component; alternatively, however, the positions of the connection pins may be determined in advance, and the holes adaptively positioned to correspond therewith.

Uncured polymer material is then put into the holes. In the method of Ser. No. 07/904,930, the uncured polymer material may comprise an epoxy loaded with silver particles, also referred to herein as "silver-loaded epoxy". The conductive polymer material is also referred to as conductive bonding glue. In some applications, however, only attachment is required, and non-conductive epoxy is employed. In either event, the uncured polymer material is put into the holes by a process such as squeegee flood stroke filling, or by metering a controlled amount of uncured polymer material into the holes using available pick-and-place glue placement equipment. To aid in leveling and flow-out of the uncured polymer material, heat may be applied to warm the assembly, while maintaining the assembly below cure temperature.

Finally, the pins of the pin-mounted component are cleaned (e.g. alcohol wash and dry) and inserted into the via holes, and the conductive polymer material is cured.

The well-like via holes serve several functions. One function is to provide a "well" to hold a sufficient quantity of conductive bonding glue surrounding the individual pins in excess of the quantity which would surround individual pins merely glued to a pad, while confining the conductive glue so that short circuits do not occur. Another function of the well-like via holes is to provide mechanical rigidity and positive positioning, and at the same time accommodate runout and short pin situations. The resultant assembly is structurally more secure than, for example, assemblies made employing conventional surface mount technology. Further, as described in Ser. No. 07/904,930, the structure is repairable. In selecting for use the method of Ser. No. 07/904,930, an important consideration is the difficulty in putting precise quantities of uncured silver-epoxy material in the well-like via holes using existing epoxy paste delivery systems.

SUMMARY OF THE INVENTION

Accordingly, it is an object of the invention to provide an alternative and improved method of putting precise quantities of uncured epoxy material into small diameter, low volume, well-like via holes.

It is another object of the invention to provide an improved method for integrating pin-mounted components into electronic circuit modules using epoxy.

In accordance with an overall aspect of the invention, a body of uncured frozen epoxy of predetermined volume is provided, and placed into a laser-drilled hole within an electronic circuit module either manually or by employing pick-and-place equipment. Typically the body of frozen epoxy is spherical, but may have a shape selected in accordance with the shape of the hole, for example cylindrical.

The body of frozen epoxy is then thawed, preferably in a vacuum chamber while the chamber undergoes evacuation. Next, the pins of a pin-mounted component are inserted into the holes, and the epoxy is cured in accordance with the epoxy manufacturer's specifications. By thawing the body of frozen epoxy in a vacuum chamber while the chamber undergoes evacuation, a pressure differential is created between the interior generally of the vacuum chamber and any pockets of air trapped in the holes beneath the epoxy. This pressure differential draws trapped air out of the pockets, and epoxy flows to fill the resultant space. Thus, epoxy tends to wet and to be drawn into the hole as the body of frozen epoxy thaws, and any air trapped within the epoxy itself is removed. Typically, the electronic circuit module and body of frozen epoxy are heated to a temperature of approximately 25° C. (room temperature) while reducing pressure from atmospheric to approximately ten microns of mercury.

Epoxies of the type employed in practicing the invention are traditionally delivered either in frozen syringes having capacities ranging from 1 cc to 10 cc, or in sheet form. Sheet form epoxy more particularly comprises twelve inch square sheets, 5 to 10 mils thick, on a fiberglass carrier. In accordance with the invention, epoxy manufacturers are requested to deliver their usual product, but in the form of frozen spheres of predetermined size.

The term "frozen" is employed herein to mean that the body of epoxy is held at a temperature low enough to keep the epoxy in an uncured state for a predetermined shelf life, and is solid enough to handle. As examples, "frozen" epoxy arrives from the manufacturer packed in dry ice at a temperature of −40° C. Epoxy can be maintained in a "frozen" state by storing it at a temperature of 0° C.

The term "thawed" is employed herein to mean that the epoxy is warm enough to flow, and yet have a predetermined working life before cure. For example, depending on the formulation, the epoxy may have a working life of up to a day at 25° C. Curing conditions are specified by the manufacturer; for example, one epoxy formulation cure in four hours at 100° C., while another formulation cures in one hour at 150° C.

In a more particular embodiment of the invention, a method of placing a predetermined quantity of uncured epoxy in a hole within an electronic circuit module includes the steps of providing a body of uncured frozen epoxy of predetermined volume, employing pick-and-place equipment to place the body of uncured frozen epoxy in the hole, and warming the electronic circuit module and body of frozen epoxy to thaw the epoxy.

In another embodiment of the invention, a method for integrating a pinmounted component with an electronic circuit module includes the initial step of providing an electronic circuit module having a generally planar surface with interconnect pads thereon, affixing a polymer mask layer to the module surface, and then laser-drilling holes in the polymer mass layer over the interconnect pads. A body of uncured frozen epoxy of predetermined volume is next placed in the hole either mechanically, by using pick-and-place equipment, or manually. Thereafter, the method proceeds with the steps of warming the electronic circuit module and body of frozen epoxy to thaw the frozen epoxy, inserting the pins of a pin-mounted component having connection pads into the holes, and curing the epoxy.

Preferably, the invention includes, in conjunction with the step of warming the electronic circuit module and body of frozen epoxy to thaw the epoxy, the step of placing the electronic circuit module and body of epoxy in a chamber, and at least partially evacuating the chamber while the body of epoxy is warming so that a pressure differential is created such that the epoxy tends to be drawn into the hole as the body of frozen epoxy thaws. In addition trapped air, if present, is removed from the epoxy. Preferably, a vacuum oven is employed to warm the electronic circuit module and the body of epoxy while reducing pressure within the vacuum oven.

It will be appreciated that the the invention offers a precise manufacturing process for constructing HDI modules and subassemblies. The use of frozen spheres of epoxy offers a significant improvement in precision dispensing and delivery of adhesives for high tolerance, small diameter laser drilled via holes in HDI electronic module

BRIEF DESCRIPTION OF THE DRAWINGS

While the novel features of the invention are set forth with particularity in the appended claims, the invention, both as to organization and content, will be better understood and appreciated from the following detailed description, taken in conjunction with the drawings, in which:

DETAILED DESCRIPTION

Figure 1:
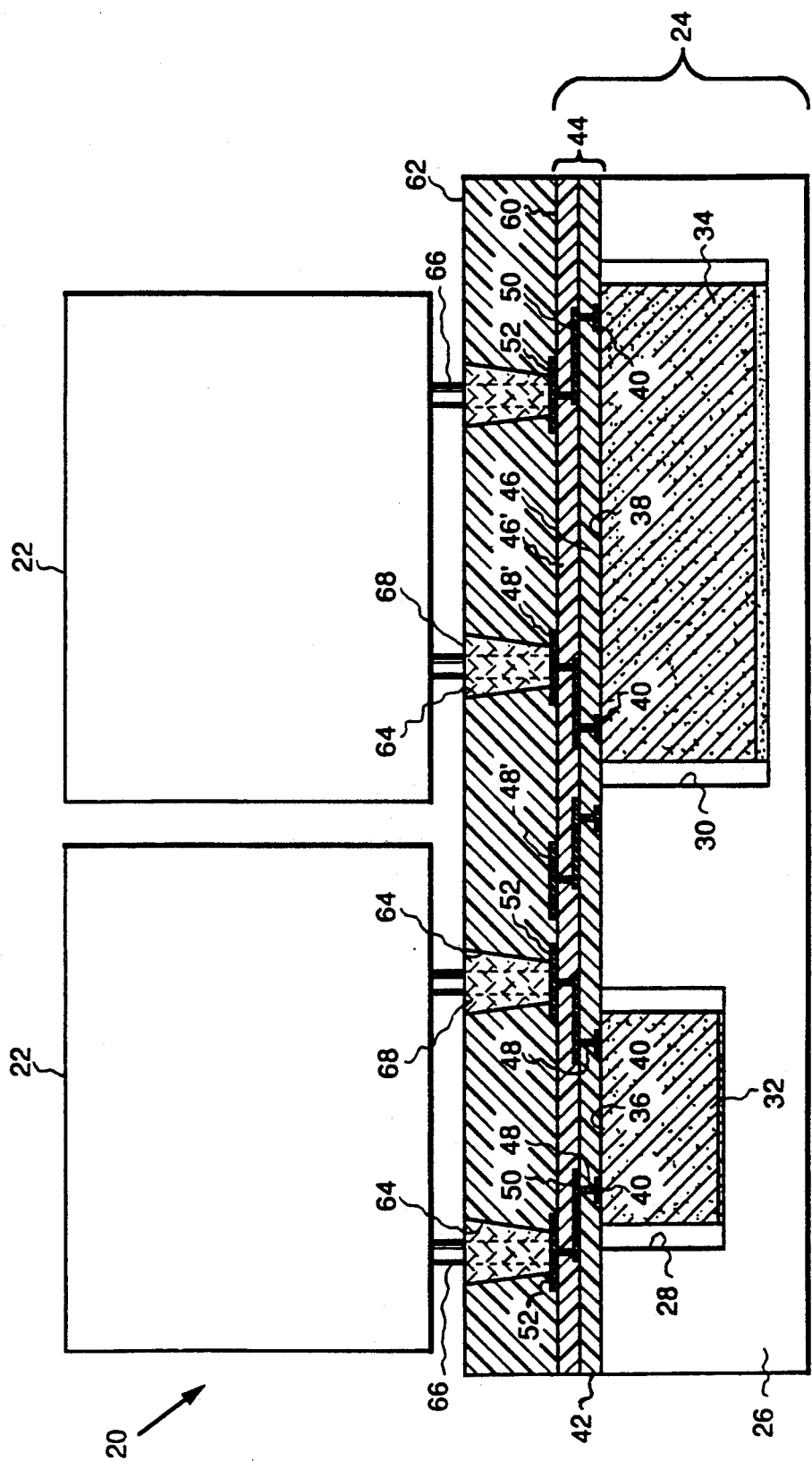
FIG. 1 is a representative side elevational view, partly in section, of an integrated electronic system including a pin-mounted memory cube integrated with a high density interconnect assembly.

FIG. 1 depicts, in highly diagrammatic form, an integrated electronic system 20 wherein a plurality of pin-mounted memory cubes 22 are integrated with a base element 24 comprising a multi-chip high density interconnect assembly or module of the type described in the various background patents referred to hereinabove. The pin-mounted memory cubes 22 are representative of any pinmounted component, including DIP components. Although not illustrated in FIG. 1, memory cubes 22 may be placed very tightly together, leaving only sufficient room for repair. Additionally, they may be potted or glued together to satisfy cooling or related requirements.

Considering the multi-chip high density interconnect assembly 24 in greater detail, a ceramic substrate 26 has representative cavities 28 and 30 formed therein by a suitable milling process, such as laser, ultrasonic or mechanical milling. Placed and adhered within cavities 28 and 30 are a plurality of components in the representative form of individual integrated circuit chips 32 and 34 having respective upper surfaces 36 and 38 with representative chip contact pads 40 disposed thereon. Upper surfaces 36 and 38 are generally even with each other (i.e. lie in a common plane) and with an upper surface 42 of substrate 26, the substrate 26 upper surface 42 being an unmilled portion of substrate 26.

The high density interconnect multi-chip module assembly 24 is completed by an interconnect overcoat 44 which is built up as described in the various patents referred to hereinabove. Briefly, a polyimide film 46 such as Kapton polyimide, which is about 12.5 to 75 microns thick, is pre-treated to promote adhesion, and is coated on one side with a polyetherimide resin or another thermoplastic, and laminated across upper surfaces 36 and 38 of chips 32 and 34, and across the upper unmilled surface 42 of substrate 26. Thereafter, via holes 48 are laser drilled in the Kapton polyimide 46 and Ultem adhesive layers in alignment with contact pads 40 on chips 32 and 34 to which it is desired to make contact. As typical dimensions, for a Kapton layer 46 which is 33 microns thick, the diameter of HDI via hole 48 may taper from 24 microns at the bottom to 50 microns at the top.

Buildup of HDI overcoat 44 continues by forming a patterned metallization layer 50 over Kapton layer 46 and extending into via holes 48 to make electrical contact with chip contact pads 40. Additional dielectric and metallization layers are provided as required (such as layers 46' and 48') in order to provide all of the desired electrical connections among chips 32 and 34, and also to provide connections, where required, with interconnect pads 52 on the upper surface 60 of HDI overcoat structure 44, which comprises a planar boundary defining the boundary of high density interconnect assembly 24.

A mask layer 62 of polymer dielectric material is bonded to planar surface 60 and to the interconnect pads. Polymer mask layer 62 is approximately two to ten mils thick, and may be prepared by spin or spray coating a glue layer onto a sheet of suitable polymer material or onto planar surface 60, and then bonding the sheet of polymer material to the underlying planar surface 60 of high density interconnect assembly 24. As one example, polymer layer 62 may comprise Kapton polyimide, the same material employed in the HDI fabrication process, but typically thicker.

Formed in polymer dielectric material mask layer 62 are a plurality of well-like via holes 64 extending to, and exposing, at least portions of interconnect pads 52. As one example, well-like via holes 64 are formed by laser dithering, without use of masks, and without damage to underlying pads 52, as is generally disclosed in the above-referenced Eichelberger et al. U.S. Pat. No. 4,894,115. However, in contrast to HDI via holes 48 within HDI overcoat layer 44, well-like via holes 64 are relatively large, as discussed hereinbelow.

Well-like via holes 64 are aligned with underlying interconnection pads 52, and interconnection pads 52 are slightly larger than well-like via holes 64 to accommodate normal tolerance variations.

Memory cubes 22 (representing any pin-mounted components) have rectangular pins 66 which extend into well-like via holes 64, preferably contacting interconnect pads 52. For securing pin-mounted components 22 in position and for electrically connecting respective pins 66 and interconnect pads 52, a conductive polymer material 68 is provided in via holes 64. Preferably, conductive polymer material 68 comprises an epoxy loaded with conductive particles, such as silver particles.

As noted above, in contrast to HDI via holes 48 within HDI overcoat layer 44, well-like via holes 64 are relatively large. For example, in the case of a polymer dielectric mask layer 62 five mils thick, and rectangular pins 66 approximately 3 mils by 4 to 8 mils ($\pm 1$ mil) by 10 to 20 mils ($\pm 2$ mils) in length, a rectangular well-like via 64 is 7 by 12 mils at the bottom, and tapers outward to 9 by 14 mils at the top. The resultant side slope is approximately 80°.

Thus, in order to provide tolerance accommodation, the shape and aspect of well-like via holes 64 are chosen with the runout parameters of memory cube 22 pins 66 in view. The thicker the polymer dielectric mask layer 62, the more exact the memory cubes 22 must be, as the sidewall angle of large well-like via holes 64 for tolerance-accommodating purposes may result in a hole that is unduly wide at the top, such that circuit conductor routing undesirably may be blocked, or shorts may occur. For maximum flexibility, therefore, it is desirable that 80° sidewalls be used whenever possible. In addition, well-like via holes 64 are designed to allow ease of placement under runout conditions, as some microcomponent leads are very fragile and bend easily. In particular, well-like via holes 64 generally are elongated in one direction, particularly where adjacent memory cubes are bonded together. Under such conditions, variation in glue thicknesses bonding the individual cubes together is a more important consideration than pin-to-pin tolerance on a single component.

Figure 2:
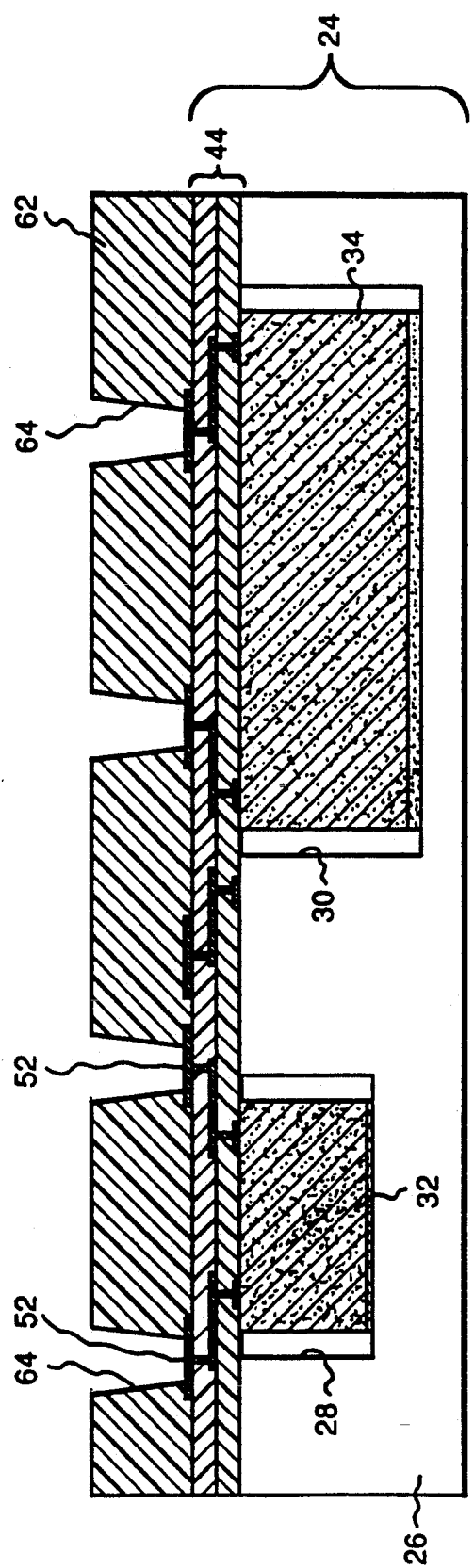
FIG. 2 depicts, in side elevational view, a step in a method of fabricating the integrated electronic system of FIG. 1.

Considering in greater detail the method of making the structure of FIG. 1, FIG. 2 depicts an intermediate step wherein polymer dielectric mask layer 62 has been applied, and well-like via holes 64 have been formed, such as by laser dithering as disclosed in U.S. Pat. No.

4,894,115. Preferably, well-like via holes 64 are dithered in place by the same laser used in other HDI processing operations; however, other methods, such as plasma milling, may be employed to form the well-like via holes by the use of an etch mask of resist or metal.

Assuming that well-like via holes 64 are produced by laser dithering, the holes are then cleaned by a short plasma etch cycle in $CF_4O_2$ or $O_2$ alone. The plasma etch removes from underlying interconnect pads 52 any particles formed during the laser beam scanning, such as soot, any residual polymer, or any glass that may be residual from any glass removal operation performed when etching a pad mask, and cleans and roughens the interior walls of hole 64 to enhance adhesion of conductive bonding glue 68 (FIG. 1) or optional metallization. A suitable plasma etch technique is to preheat both the part and a chamber in which the part is placed, to a temperature of 110° C. in $N_2$, and then to etch the part for two minutes at a power of 150 watts in an atmosphere of 20% $CF_4$ and 80% $O_2$. In addition, a backsputtering step may be performed and an adhesion promoting layer of sputtered titanium may be applied and patterned, as epoxy does not stick well to polyimide predictively.

Figure 3:
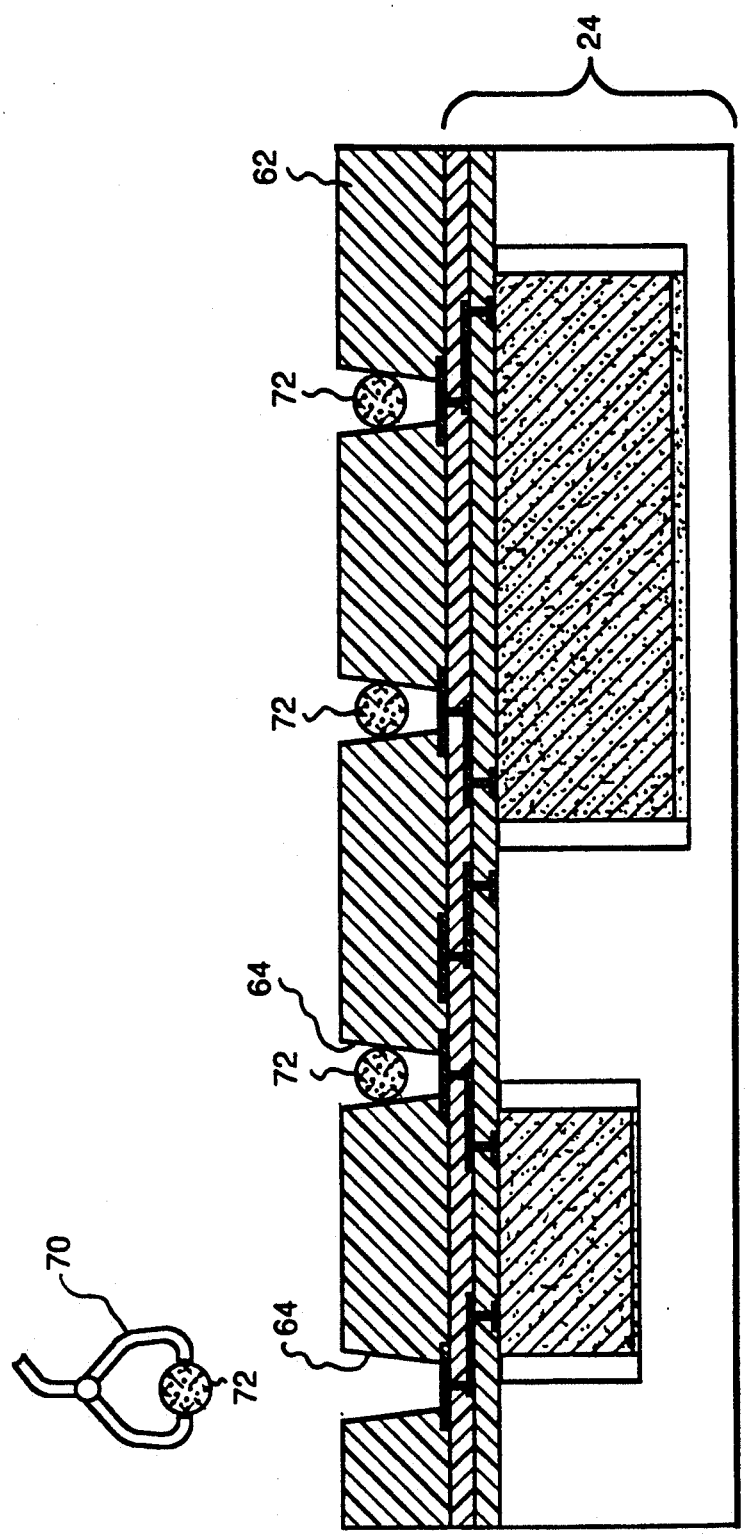
FIG. 3 depicts, in side elevational view, the use of pick-and-place equipment to place a sphere of uncured frozen epoxy.
Figure 4:
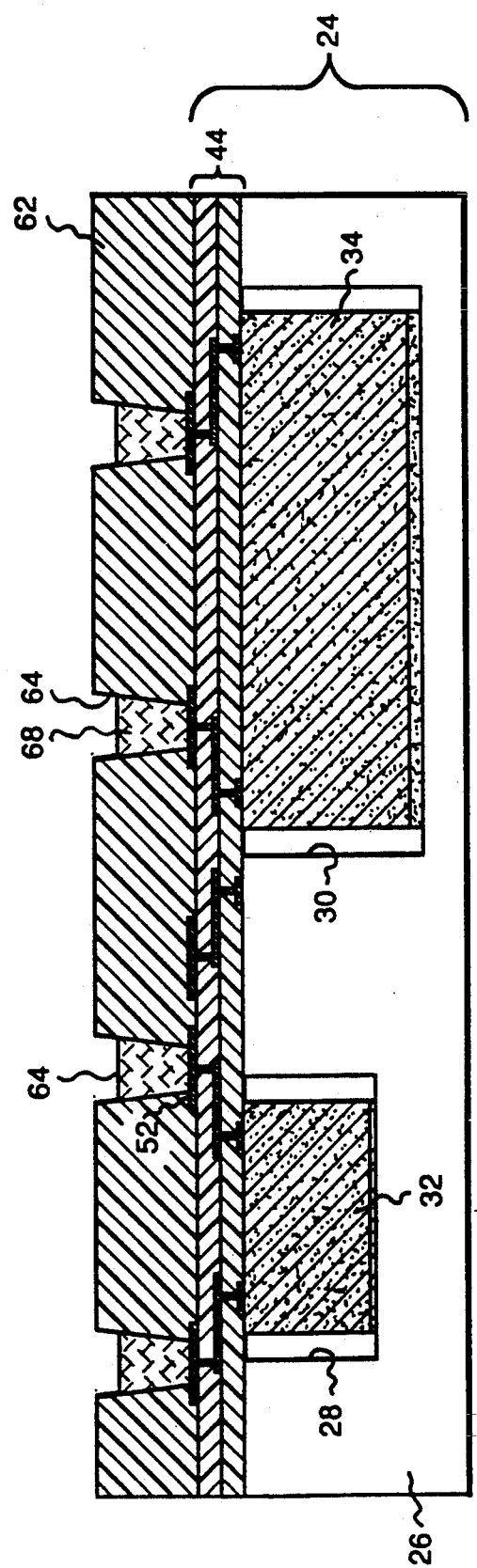
FIG. 4 depicts, in side elevational view, uncured epoxy in holes after thawing from its frozen state.

FIG. 3 depicts in highly-schematic form the use of pick-and-place equipment, represented by a manipulator 70, to place a sphere 72 of frozen epoxy into any one of well-like via holes 64. Sphere 72 has a predetermined size to occupy a corresponding predetermined volume; for example, in the case of well-like via holes 64 sized as described above, frozen epoxy spheres 72 approximately 0.005 inch in diameter are employed. After epoxy spheres 72 are thawed, as described hereinbelow, to produce uncured epoxy material 68, the structure containing via holes 64 appears as depicted in FIG. 4, which illustrates thawed uncured epoxy material prior to component pin insertion. As evident in FIG. 4, holes 64 are not filled to the top with uncured epoxy material 68. Thus the resultant volume of uncured epoxy material 68 is controlled by selection of the size of frozen epoxy spheres 72 so that holes 64 do not overflow when the component pins are later inserted. This is particularly critical since glue 68, being conductive, can cause shorts, especially as the epoxy drops in viscosity during cure. Thus well-like via holes 64 allow sufficient amounts of glue 68 to be present to yield good electrical connection to component pins, to provide mechanical integrity, and to constrain the epoxy.

Epoxies of the type employed in the practice of the invention are traditionally delivered either in frozen syringes having capacities ranging from 1 to 10 cc, or in sheet form. Sheet form epoxy more particularly comprises twelve inch square sheets, 5 to 10 mils thick, on a fiberglass carrier. In accordance with the invention, epoxy manufacturers are requested to deliver their usual product, but in the form of frozen spheres of predetermined size. Examples of suitable epoxy formulations are Ablebond ® 84-1LMIS (conductive paste) and Ablefilm ECF 561-1 (conductive film), made by ABLESTIK or Rancho Dominguez, Calif.

Figure 5:
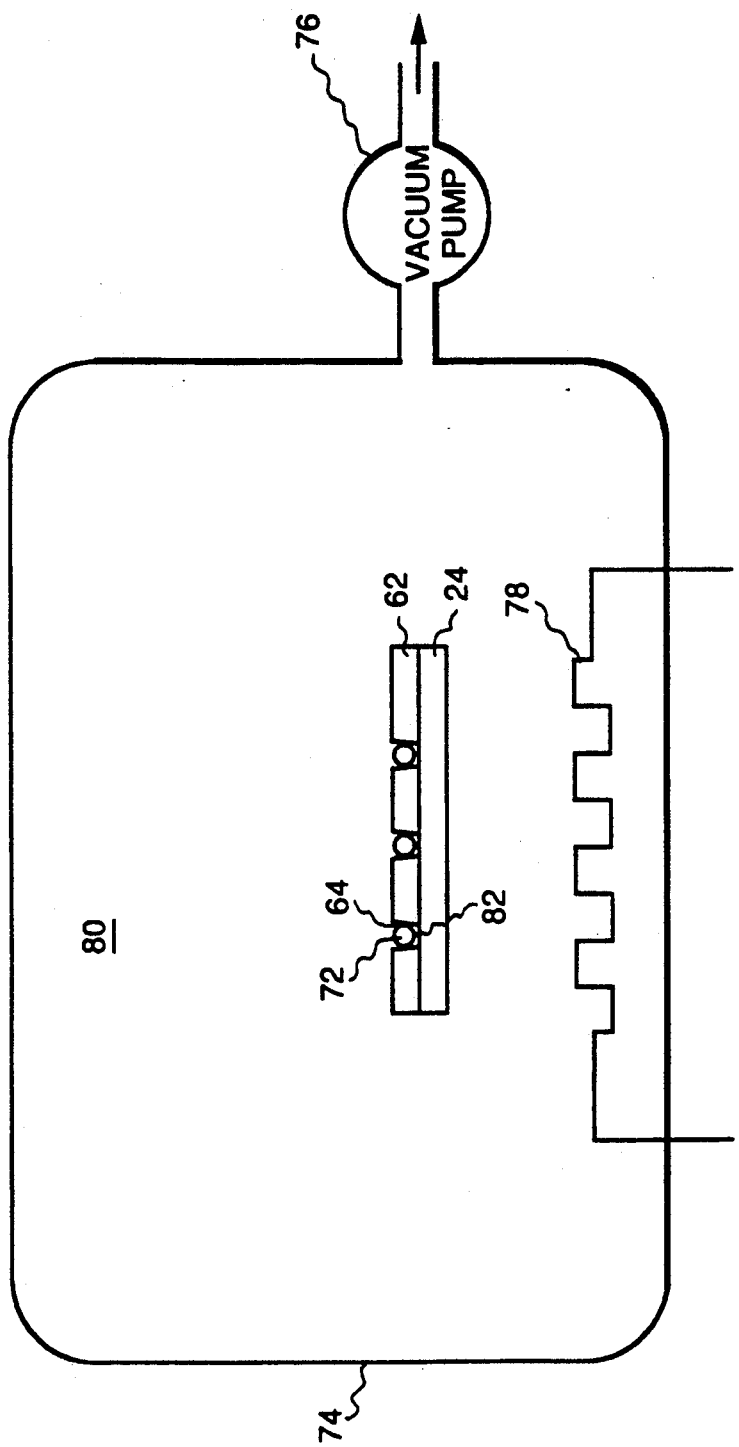
FIG. 5 is a schematic illustration of spheres of frozen epoxy thawing in a vacuum oven.

To thaw frozen epoxy spheres 72, the HDI assembly 24, mask layer 62 and frozen epoxy spheres 72 shown in FIG. 3 are warmed to approximately 25° C. (room temperature). To promote wetting and flow of the epoxy into holes 64 to arrive at the condition depicted in FIG. 4, the HDI assembly 24, mask layer 62 and frozen epoxy spheres 72 are warmed in a vacuum oven 74, as depicted schematically in FIG. 5, while the vacuum oven is being evacuated. Vacuum oven 74 includes a vacuum pump 76 and a heating element 78. During the process of drawing down the pressure within vacuum oven 74 from atmospheric down to a sufficient vacuum level (ten microns of mercury, for example), a pressure differential is created between the evacuated interior 80 (i.e., the interior generally) of vacuum oven 74 and any pockets 82 of air trapped within holes 64 below epoxy spheres 72. This pressure differential draws trapped air out of pockets 82, and epoxy flows to fill the resultant space.

After the epoxy is thawed, memory cubes 22 (FIG. 1), or DIP packages, as the case may be, are placed by a pick and place machine (to avoid pin bending). If necessary to aid in part placement and epoxy flowout, epoxy-filled well-like via holes 64 are preheated slightly above thawing temperature, which lowers the epoxy viscosity. Module 20 is the ready for bake and cure. The cure is generally allowed to occur at a temperature in the range of 130°-150° C. for one or two hours, followed by a 170° to 200° C. post-bake cure for one-half hour. These temperatures and times are exemplary only, and of course vary with the particular epoxy which is used.

In accordance with the invention, frozen epoxy may be provided in shapes other than spheres. A body of uncured frozen epoxy may be provided in accordance with the shape of the hole, for example as a cylinder, the frustrum of a cone, a solid rectangle, or a trapezohedron, as the case may be.

As described in greater detail in the above-incorporated application Ser. No. 07/904,930, it may be preferable to metallize the insides of well-like via holes 64. The metallized via holes are relatively insensitive to pin length and epoxy path length resistivity considerations. In addition, epoxy adheres better when the well-like via holes are metallized.

Figure 6:
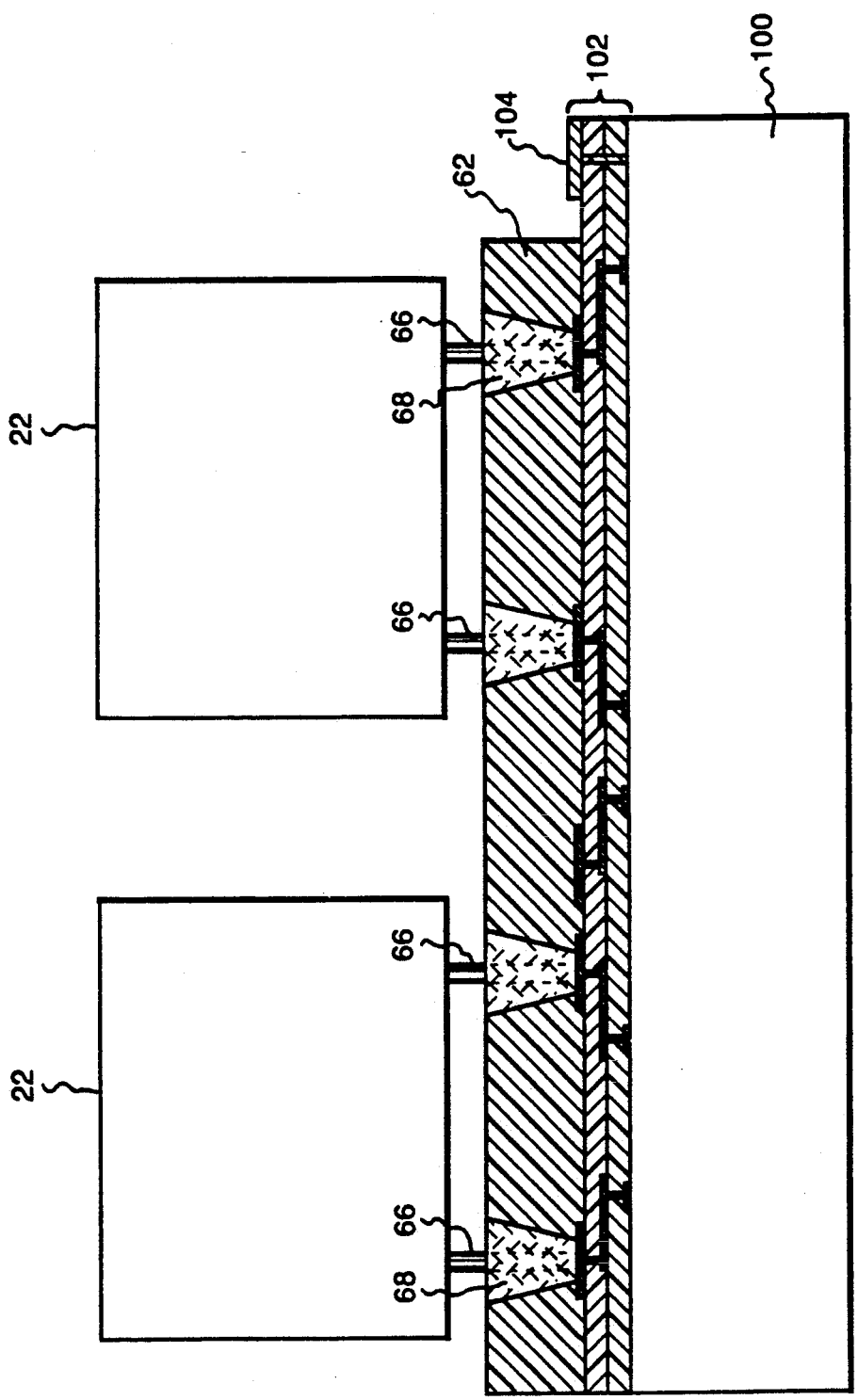
FIG. 6 depicts, in side elevational view, an alternative embodiment of the invention wherein the base element is a printed circuit board.

In the embodiments of FIGS. 1-5, the base element comprises a high density interconnect assembly 24. However, the base element may alternatively comprise any one of a variety of structures having a generally planar boundary with interconnection pads on the boundary. FIG. 6 depicts one such alternative, in the form of a printed circuit board 100, which optionally may have a multilayer interconnect structure 102 formed thereon, comparable to multilayer interconnect structure 44 of FIGS. 1-4. Multilayer interconnect structure 102, either alone in combination with conductors (not shown) on printed circuit board 100, provides suitable interconnections among memory cubes 22, and additionally provides terminals 104 for external connection. The resultant structure comprises a mass memory module.

Figure 7:
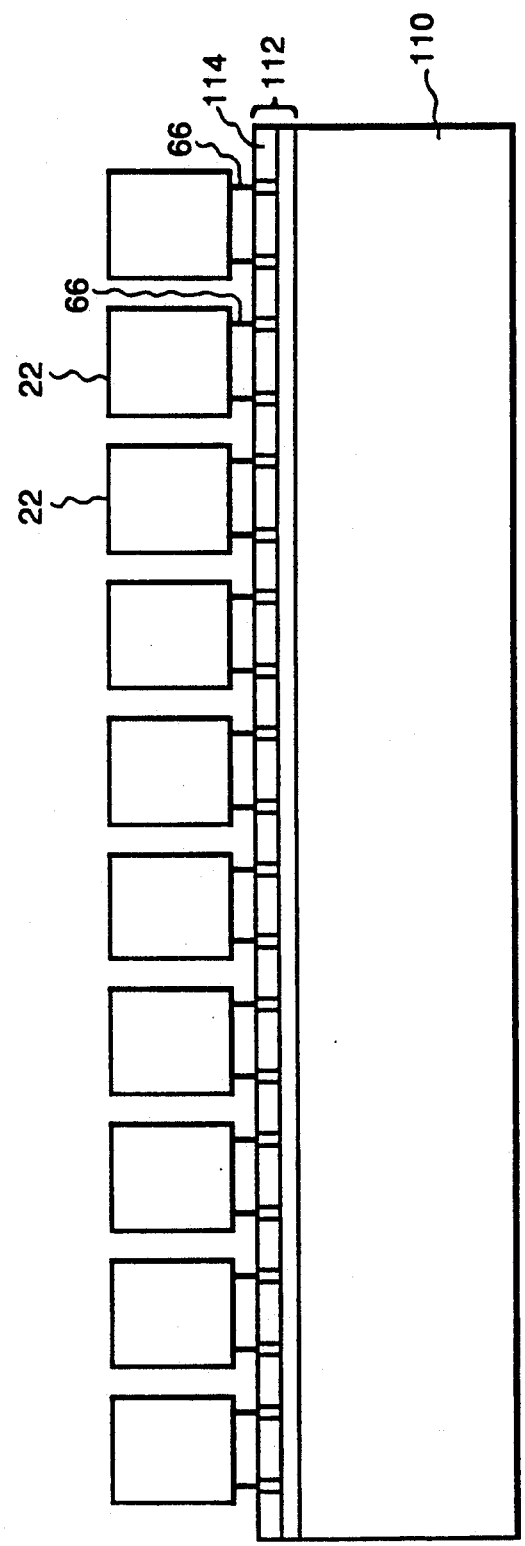
FIG. 7 depicts, in side elevational view, yet another alternative embodiment of the invention wherein the base element is an HDI substrate.

FIG. 7 depicts, in highly schematic form, yet another variation of the invention, wherein the base element is a substrate 110 of ceramic or other suitable material, which may comprise an unmilled portion of the substrate of a high density interconnect assembly as described above, with a multilayer interconnect structure 112 thereover. A mask layer 114, analogous to mask layer 62 of FIGS. 1-5, supports pins 66 of each of memory cubes 22 as described hereinabove.

While specific embodiments of the invention have been illustrated and described herein, it is realized that numerous modifications and changes will occur to those skilled in the art. It is therefore to be understood that the appended claims are intended to cover all such modifications and changes as fall within the true spirit and scope of the invention.

What is claimed is:

1. A method of placing a predetermined quantity of uncured epoxy in a hole of predetermined dimensions within an electronic circuit module, said method comprising the steps of:

providing a body of uncured frozen epoxy of predetermined volume;

placing the body of uncured frozen epoxy in the hole;

placing the electronic circuit module and body of frozen epoxy in a chamber; and warming the electronic circuit module and body of epoxy to thaw the body of epoxy while at least partially evacuating the chamber so that a pressure differential is created sufficient to cause the epoxy to be drawn into the hole as the body of frozen epoxy thaws.

2. A method in accordance with claim 1, wherein the step of providing a body of uncured frozen epoxy comprises providing a body having a shape selected in accordance with the shape of the hole.

3. A method in accordance with claim 1, wherein the step of providing a body of uncured frozen epoxy comprises providing a body having a shape that at least approximates a sphere.

4. A method in accordance with claim 1, wherein the step of placing the body of uncured frozen epoxy in the hole comprises placing the body of epoxy in the hole manually.

5. A method in accordance with claim 1, wherein the step of placing the body of uncured frozen epoxy in the hole comprises placing the body of epoxy in the hole mechanically with pick-and-place equipment.

6. A method in accordance with claim 1, wherein the step of warming the electronic circuit module and body of epoxy to thaw the body of epoxy comprises warming the electronic circuit module and body of epoxy to a temperature of approximately 25° C.

7. A method in accordance with claim 1, including the steps of employing, as said chamber, a vacuum oven to warm the electronic circuit module and the body of frozen epoxy while reducing pressure within the vacuum oven.

8. A method in accordance with claim 7, wherein the electronic circuit module and body of frozen epoxy are warmed to a temperature of approximately 25° C. while reducing pressure from atmospheric to a pressure sufficient to provide removal of any air trapped by said epoxy.

9. A method of integrating a pin-mounted component with an electronic circuit module, said method comprising the steps of:

providing an electronic circuit module having a generally planar surface with interconnect pads on the module surface;

applying a polymer mask layer to the module surface;

laser-drilling holes in the polymer mask layer over the interconnect pads;

providing a plurality of bodies of uncured frozen epoxy, each body being of predetermined volume;

placing each body of uncured frozen epoxy in a separate respective one of the holes;

warming the electronic circuit module and the bodies of epoxy to thaw the bodies of epoxy;

inserting each connection pin of a pin-mounted component into a separate respective one of the holes; and curing the epoxy.

10. A method in accordance with claim 9, wherein the step of providing a plurality of bodies of uncured frozen epoxy comprises providing a plurality of said bodies wherein each of said bodies has a shape selected in accordance with the shape of the respective hole into which it is to be inserted.

11. A method in accordance with claim 9, wherein the step of providing a plurality of bodies of uncured frozen epoxy comprises providing a plurality of said bodies wherein each of said bodies has a shape that at least approximates a sphere.

12. A method in accordance with claim 9, wherein the step of placing each body of uncured frozen epoxy in a separate respective one of the holes comprises placing the bodies of epoxy in the respective holes manually.

13. A method in accordance with claim 9, wherein the step of placing each body of uncured frozen epoxy in a separate respective one of the holes comprises placing the bodies of epoxy in the respective holes mechanically with pick-and-place equipment.

14. A method in accordance with claim 9, wherein the step of warming the electronic circuit module and bodies of epoxy to thaw the bodies of epoxy comprises warming the electronic circuit module and bodies of epoxy to a temperature of approximately 25° C.

15. A method in accordance with claim 9, wherein the step of warming the electronic circuit module and bodies of epoxy to thaw the bodies of epoxy further comprises the steps of:

placing the electronic circuit module and bodies of frozen epoxy in a chamber; and at least partially evacuating the chamber while the bodies of frozen epoxy are warming so that a pressure differential is created sufficient to cause the epoxy to be drawn into the holes as the bodies of frozen epoxy thaw.

16. A method in accordance with claim 15, wherein the electronic circuit module and bodies of frozen epoxy are warmed to a temperature of approximately 25° C.

17. A method in accordance with claim 15, including the step of employing, as said chamber, a vacuum oven to warm the electronic circuit module and the bodies of frozen epoxy while reducing pressure within the vacuum oven.

18. A method in accordance with claim 17, wherein the electronic circuit module and bodies of frozen epoxy are warmed to a temperature of approximately 25° C. while reducing pressure from atmospheric to a pressure sufficient to provide removal of any air trapped by said epoxy.

* * * * *